United States Patent [19]

Bhatia et al.

[11] 3,757,138

[45] Sept. 4, 1973

[54] PUSH-PULL LINE DRIVER CIRCUIT

[75] Inventors: Harsaran S. Bhatia, Fishkill; Donald E. Davis, Wappingers Falls, both of N.Y.; David H. Martin, Chandlers Ford, England

[73] Assignee: International Business Machines Corporation, Armonk, N.Y.

[22] Filed: May 4, 1972

[21] Appl. No.: 250,213

[52] U.S. Cl. ............ 307/235 R, 307/237, 330/30 D

[51] Int. Cl. ............ H03k 5/20

[58] Field of Search ............ 307/235, 237; 330/30 D

[56] References Cited

UNITED STATES PATENTS

| | | | |
|---|---|---|---|
| 3,609,405 | 9/1971 | Surprise et al. | 330/30 D |
| 3,413,492 | 11/1968 | Schneider | 330/30 D |
| 3,470,486 | 9/1969 | Beelitz | 330/30 D |

*Primary Examiner*—John Zazworsky
*Attorney*—Martin G. Reiffin et al.

[57] ABSTRACT

A line driver circuit for driving highly capacitive or low impedance loads such as the data and power lines that extend from chip to chip of integrated memory and logic circuits utilized in digital computers, peripheral apparatuses therefor and similar digital equipment. The line driver circuit comprises a current switch direct-current-coupled to a single-ended push-pull output stage. The current switch comprises a pair of transistors having their emitters connected to a current source. The output stage comprises a pair of output transistors with the emitter of one output transistor and the collector of the other transistor connected together and to the output of the circuit. The collectors of the current switch transistors are direct-current-coupled to the respective bases of the output stage transistors. The line driver circuit further comprises an active feedback network for limiting the amplitude of the downward swing of the potential of the output terminal of the output stage and including a feedback transistor having its emitter connected to the output of the output stage and its collector connected to the collector of one of the current switch transistors.

14 Claims, 2 Drawing Figures

PUSH-PULL LINE DRIVER CIRCUIT

BACKGROUND OF THE INVENTION

1. Field of the Invention

This invention relates to line driver circuits for driving highly capacitive or low impedance loads such as data or power lines which extend from chip to chip of integrated circuitry of the type employed in digital computers, peripheral apparatuses therefor and similar digital equipment.

2. Description of the Prior Art

In the prior art, highly capacitive or low impedance loads such as data and power lines extending from chip to chip of integrated circuitry are usually driven either by logic circuits or emitter follower circuits. These prior art driver circuits have two major disadvantages as compared with the circuit of the present invention. First, the prior art driver circuits have excessive power dissipation resulting in a limitation on the circuit density which can be achieved without causing excessive operating temperatures. This is because the output stage incudes a load resistor which has to have a relatively small resistance in order to achieve an adequately fast switching speed. This small resistance results in the flow of a large current through the load resistor and the output transistor during the active half of the drive cycle.

Second, the prior art driver circuits provide an active or positive drive in only one direction. That is, the emitter follower circuits provide an active drive during only the upward swing of the output potential, and the logic circuits which have the output connected to a transistor collector provide active drive only during the downward swing of the output potential. During the other half of the switching cycle, these prior art circuits provide only an inactive drive through the load resistor. This results in a relatively slower switching speed during the inactive drive half of the switching cycle.

SUMMARY OF THE INVENTION

It is therefore a primary object of the present invention to provide a novel line driver circuit which obviates the two above-noted disadvantages of line driver circuits in accordance with the prior art. That is, excessive power dissipation is avoided, and active drive is provided during both the upward and downward halves of the switching cycle.

The line driver circuit of the present invention comprises a first current switch stage direct-current-coupled to a single-ended push-pull output stage. The latter has no load resistor, thereby eliminating excessive power dissipation from this source. The output stage comprises two output transistors with the emitter of one transistor and the collector of the other transistor connected to the output terminal. During the upward swing of the output potential, the load is driven through the emitter of the upper output transistor while the lower output transistor remains cut off, whereas during the downward swing of the output potential the load is driven through the collector of the lower output transistor while the upper output transistor remains cut off. Active drive is thereby provided for both halves of the switching cycle so that highly capacitive or low impedance loads may be driven at relatively fast switching speeds.

The line driver circuit in accordance with the present invention further comprises an active feedback network for limiting the amplitude of the downward swing of the output potential. This feedback network comprises a feedback transistor having its emitter connected to the output of the output stage and its collector connected to the collector of one of the current switch transistors.

The present line driver circuit also comprises means for limiting the upward swing of the output potential and comprising a voltage source and a clamping diode having one end connected to the voltage source and the other end connected to the collector of one of the current switch transistors.

These two means for limiting respectively the upward and downward swings of the output potential provide an output signal with predetermined upper and lower potential limits, and also prevent the current switch transistors and output stage transistors from becoming saturated, thereby enabling the subject line driver circuit to operate at relatively fast switching speeds.

Other objects and advantages of the present invention are inherent in the structure disclosed and/or will be apparent to those skilled in the art as the detailed description proceeds.

DESCRIPTION OF THE PREFERRED EMBODIMENTS

Figure 1:
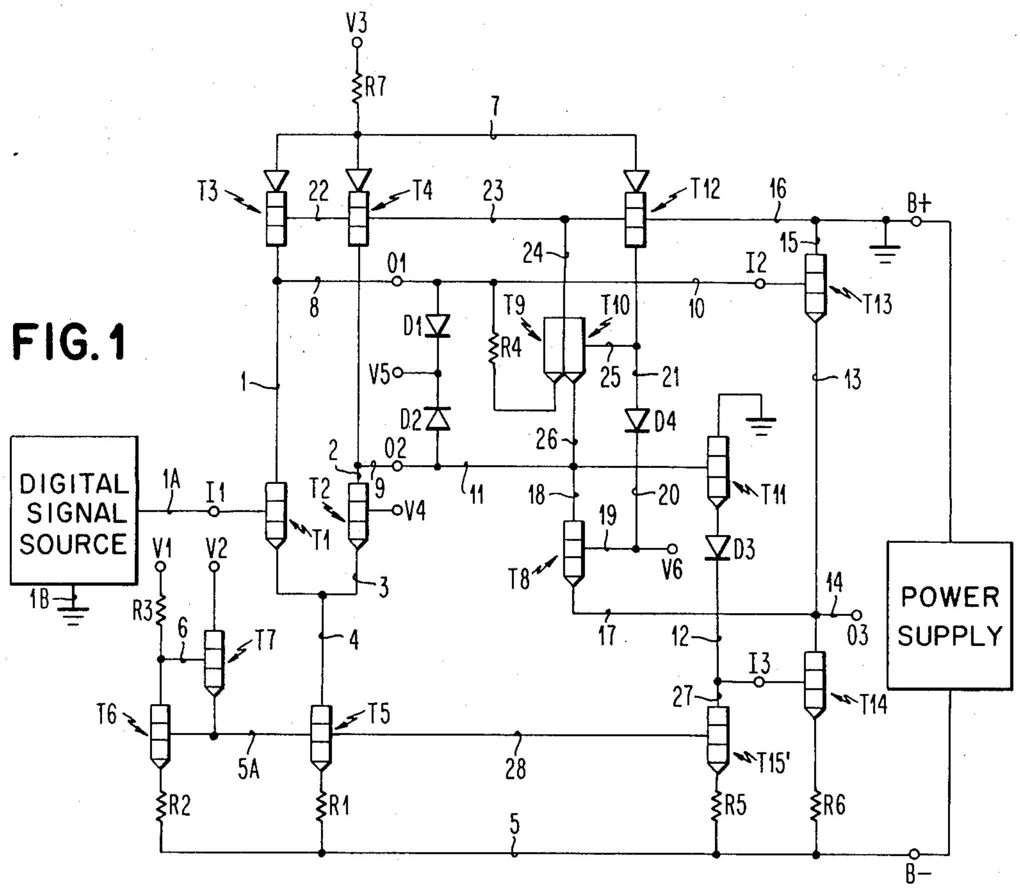
FIG. 1 discloses a first embodiment of a line driver circuit in accordance with the present invention.

Structure of the Embodiment of FIG. 1

Referring first to FIG. 1, there is shown a first embodiment of a line driver circuit in accordance with the present invention. The first stage is a current switch comprising NPN transistors T1 and T2. The collector of transistor T1 is connected by a lead 1 to the collector of a PNP load transistor T3, and the collector of transistor T2 is similarly connected by a lead 2 to the collector of a PNP load transistor T4. The emitters of current switch transistors T1, T2 are interconnected by a lead 3 which is in turn connected by a lead 4 to the collector of a current source transistor T5.

The input terminal I1 of the current switch T1, T2 is connected to the hot output line 1A of a digital signal source having its other output line 1B grounded as shown. Input terminal I1 is connected directly to the base of current switch transistor T1, and the base of current switch transistor T2 is connected to a voltage source V4.

The emitter of current source transistor T5 is connected to the upper end of a resistor R1 having its lower end connected to a lead 5 in turn connected to the $B^-$ terminal of a power supply. The base of transistor T5 is connected by a lead 5a to the base of a first voltage regulating transistor T6. The emitter of the latter is connected to the upper end of a resistor R2 having its lower end connected to lead 5. The base of transistor T6 is also connected to the emitter of a second voltage regulating transistor T7 having its base connected by a lead 6 to the collector of transistor T6. The collector of the latter is also connected to the lower end of a resistor R3 having its upper end connected to a voltage supply V1.

The emitters of PNP load transistors T3, T4 are connected to a lead 7 in turn connected to the lower end of a resistor R7 having its upper end connected to a voltage supply V3. The current switch T1, T2 has two outputs at the collectors of these transistors, the output at the collector of transistor T1 being symbolized by the node O1 and the output at the collector of transistor T2 being symbolized by the node O2. Output O1 is connected by leads 8 and 1 to the collector of transistor T1 and output O2 is connected by leads 9 and 2 to the collector of transistor T2. Output O1 is also connected by a lead 10 to an input I2 of an output stage, and the other output O2 of the current switch is connected through lead 11, transistor T11, diode D3 and lead 12 to the other input I3 of the output stage.

The output stage comprises a pair of output transistors T13, T14 connected in a single-ended push-pull arrangement. The emitter of upper output transistor T13 is connected by a lead 13 to the collector of lower output transistor T14, said emitter and collector being also connected to the output O3 of the output stage by a lead 14. The collector of upper output transistor T13 is connected by a lead 15 to the lead 16 in turn connected to the $B^+$ terminal of the power supply. The emitter of lower output transistor T14 is connected to the upper end of a resistor R6 having its lower end connected to lead 5 in turn connected to the $B^-$ terminal of the power supply. The $B^+$ terminal of the power supply may be grounded as shown.

An active feedback network extends from output O3 of output stage T13, T14 to output O2 of current switch T1, T2 and comprises a feedback transistor T8 having its emitter connected by leads 17 and 14 to output O3 and its collector connected by leads 18 and 11 to current switch output O2. The base of feedback transistor T8 is connected by a lead 19 to a voltage supply V6.

Also connected to voltage supply V6 by a lead 20 is the cathode of a diode D4 having its anode connected by a lead 21 to the collector of a PNP transistor T12 having its emitter connected to the lower end of resistor R7 through lead 7. The bases of PNP transistors T3, T4, T12 are interconnected by leads 22, 23 and are connected by a lead 16 to the $B^+$ terminal of the power supply.

There are further provided a pair of transistors T9, T10 having a common collector and a common base and separate emitters. The common collector is connected by leads 24 and 16 to the $B^+$ terminal of the power supply and the common base is connected by leads 25 and 21 to the anode of diode D4 and to the collector of transistor T12. The emitter of transistor T10 is connected by leads 26 and 11 to the output O2 of current switch T1, T2. The emitter of transistor T9 is connected to one end of a resistor R4 having its other end connected to current switch output O1 and output stage input I2 through lead 10.

There are further provided a pair of clamping diodes D1, D2 having their anodes connected to current switch outputs O1, O2 respectively, and their cathodes connected to a voltage source V5.

The cathode of diode D3 and input I3 of the output stage are connected by a lead 27 to the collector of a current source transistor T15′ having its emitter connected to the upper end of a resistor R5 having its lower end connected through lead 5 to the $B^-$ terminal of the power supply. The base of current source transistor T15′ is connected by a lead 28 to the base of current source transistor T5 and hence to the base of voltage regulating transistor T6 through lead 5A.

The preferred parameters of the circuit of FIG. 1 are as follows:

$B^- = -2.5$ volts
V1 = +1.5 volts
V2 = 0 volts, ground
V3 = +1.5 volts
V4 = −1.1 volts
V5 = −0.7 volts
V6 = −.93 volt
R1 = 800 ohms
R2 = 800 ohms
R3 = 3370 ohms
R4 = 500 ohms
R5 = 800 ohms
R6 = 30 ohms
R7 = 666 ohms

Operation of the Embodiment of FIG. 1

The operation of the embodiment of FIG. 1 will now be described. Transistors T1 and T2 function as a current switch and transistor T5 serves as the current source. The base of transistor T2 is maintained by voltage source V4 at a constant potential of −1.1 volts. The digital signal source transmits a digital signal to input I1 and hence to the base of transistor T1. The digital signal has an up level greater than the potential of voltage source V4 and a down level less than the potential of said voltage source.

Assume first that the digital signal applied to input I1 is at a down level. In this event, transistor T1 is cut off and the current supplied by transistor T5 flows entirely through transistor T2. This current is greater than the current supplied by load transistor T4 and the additional current required is supplied by transistor T10 through leads 26 and 11. Transistor T10 exerts a clamping action on the collector of transistor T2 to keep the latter out of saturation, and also keeps diode D3 and transistor T11 from cutting off so as to eliminate the turn-on time that would otherwise be required.

Diode D4 is conductive and is provided with current by the collector of transistor T12. Therefore, the potential of the base of transistor T10 is maintained at the potential (−.93 volt) of voltage source V6 plus the voltage drop across diode D4. The base of transistor T11 is clamped by the emitter of transistor T10 and is thus maintained at a potential equal to the potential of voltage source V6 plus the diode voltage drop across voltage source V4 minus the potential drop across the base-emitter junction of transistor T10, or at a potential approximately equal to the potential of the voltage source V6.

The clamped potential at the base of transistor T11 is translated across the base-emitter junction of transistor T11 and diode D3 which is maintained conductive by current source transistor T15. The base of lower output transistor T14 is thus biased to a potential which maintains output transistor T14 cut off. Transistors T8 and T9 and diode D2 are also cut off.

The potential of the collectors of transistors T1 and T3 is at an up level and the current from the collector of transistor T3 drives the base of upper output transistors T13 so as to render the latter conductive and to maintain the potential of output O3 at an up level. The magnitude of the up level potential of output O3 is determined by voltage source V5 and diode D1 which clamps the upward potential swing at the base of upper output transistor T13 to maintain the up level potential of output O3 at the desired predetermined magnitude. The latter is equal to the potential (−.7 volt) of voltage source V5 plus the potential drop across diode D1 minus the potential drop across the base-emitter junction of upper output transistor T13, or approximately equal to the potential of voltage source V5. This up level potential of output O3 is relatively independent of temperature or diode tolerances because the potential drop across diode D1 tracks the potential drop across the base-emitter junction of output transistor T13 with variations in temperature.

Assume now that the digital signal transmitted to input I1 is at an up level above the potential of voltage source V4. In this event, transistor T2 is cut off and transistor T1 is rendered conductive with the entire current from source transistor T5 transmitted through transistor T1. The latter is kept out of saturation by the clamping action of transistor T9 and resistor R4, thereby also limiting the reverse bias applied to the base of upper output transistor T13.

The potential of the collectors of transistors T2 and T4 is at an up level and the current from the collector of transistor T4 renders diode D2 conductive and drives the base of transistor T11. The potential at the base of transistor T11 is translated through the base-emitter junction of transistor T11 and through diode D3 to the base of lower output transistor T14 to render the latter conductive.

Therefore, the potential at the collector of transistor T14 and hence at output O3 and at the emitter of transistor T8 swings downwardly until transistor T8 is rendered conductive. Transistor T8 then diverts current from diode D2 and the base of transistor T11 so as to limit the downward potential swing of the collector of lower output transistor T14 by reducing the drive at the base of lower output transistor T14 until the latter is driving only enough current through the load to maintain the potential of output O3 at the lower level. The lower potential level of output O3 is thus predetermined by the feedback network comprising transistor T8 and lower output transistor T14 is thereby kept out of saturation. The magnitude of the low level potential of output O3 may be selected by choosing the appropriate value for the potential of voltage source V6.

The current through conductive current switch transistor T1 and current source transistor T5 is greater than the current available from the collector of load transistor T3. The extra current is supplied by transistor T9 through resistor R4. The potential of the base of transistor T9 is held to one base-emitter voltage drop above the potential of voltage source V6 by diode D4 which is rendered conductive by current source transistor T12.

Therefore, the base of upper output transistor T13 is maintained at a potential equal to the potential (−.93 volt) of voltage source V6 plus the potential drop across diode D4 minus the base-emitter voltage drop of transistor T9 minus the voltage drop across resistor R4, or approximately equal to the potential of voltage source V6 minus the voltage drop across resistor R4. This guarantees that upper output transistor T13 will not turn on since the potential at output O3 and hence at the emitter of upper output transistor T13 is equal to the potential of voltage source V6 minus the base-emitter voltage of transistor T8.

Diode D1 and transistor T10 are cut off when output O3 is at the lower potential level. Diode D2 limits the upward swing of the potential at the collector of transistor T2 and the base of transistor T11 so as to limit the drive to the base of lower output transistor T14 and thereby prevents excessive collector current in transistor T14.

Figure 2:
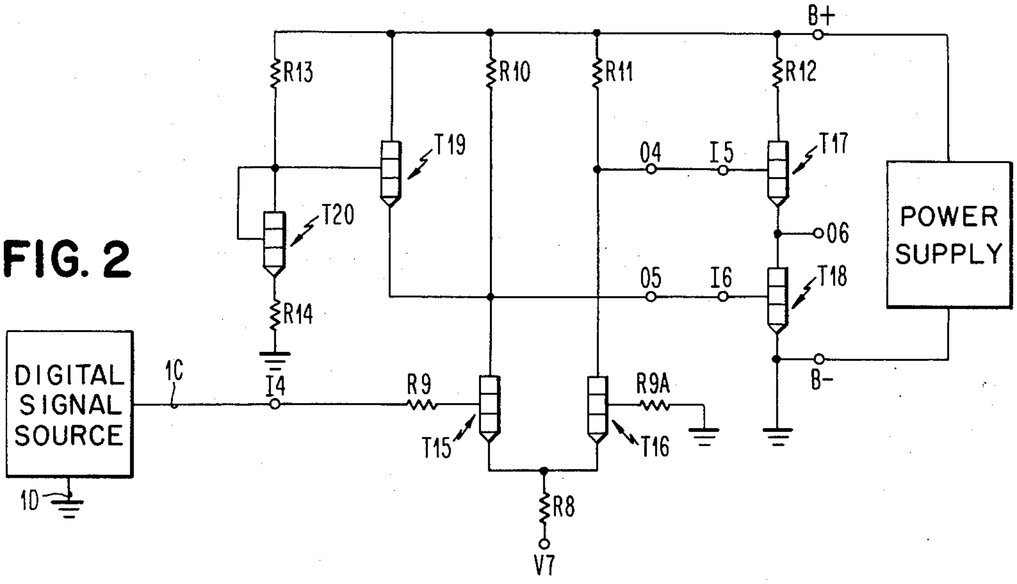
FIG. 2 discloses another embodiment of a line driver circuit in accordance with the invention.

Structure of the Embodiment of FIG. 2

Referring now to FIG. 2, there is shown another embodiment of the invention. Transistors T15 and T16 constitute a current switch and have their emitters connected together and to the upper end of a resistor R8 having its lower end connected to a voltage source V7. Resistor R8 and voltage source V7 constitute a current source for the switch. The base of transistor T15 is connected through a resistor R9 to the input symbolized by node I4. The latter is connected to the hot output lead 1C of a digital signal source having its other output lead 1D connected to ground as shown.

The base of current switch transistor T16 is connected to ground through resistor R9A. A load resistor R10 has its upper end connected to the $B^+$ terminal of the power supply and its lower end connected to the collector of current switch transistor T15. A second load resistor R11 has its upper end connected to the $B^+$ terminal of the power supply and its lower end connected to the collector of current switch transistor T16. The current switch is provided with two outputs symbolized by the nodes O4 and O5, respectively. Output O4 is connected to the collector of current switch transistor T16 and output O5 is connected to the collector of current switch transistor T15.

The output stage is of the single-ended push-pull type and comprises a pair of output transistors T17, T18. The emitter of upper output transistor T17 is connected to the collector of lower output transistor T18 and to output terminal O6. The collector of upper output transistor T17 is connected to the lower end of a resistor R12 having its upper end connected to the $B^+$ terminal of the power supply. The emitter of lower output transistor T18 is connected to the grounded $B^-$ terminal of the power supply.

The inputs of output stage T17, T18 are symbolized by nodes 15, 16. Input 15 of the output stage is direct-coupled to output O4 of the current switch, and input I6 of the output stage is direct-coupled to output O5 of the current switch.

A clamping transistor T19 has its collector connected to the power supply $B^+$ terminal and its emitter connected to the collector of current switch transistor T15. The base of transistor T19 is connected to the lower end of a resistor R13 having its upper end connected to said $B^+$ terminal. The lower end of resistor R13 and the base of transistor T19 are also connected to the collector of a transistor T20. The latter is diode-connected in that its collector is shorted to its base. The emitter of transistor T20 is connected to the upper end of a resistor R14 having its lower end connected to ground.

The preferred parameters of the circuit of FIG. 2 are as follows:

$B^+ = +2.0$ volts
V7 = −3.0 volts
R7 = 1.2K ohms
R8 = 50 ohms
R9 = 50 ohms
R10 = 1.0K ohms R11 = 850 ohms
R12 = 100 ohms
R13 = 500 ohms
R14 = 200 ohms

Operation of the Embodiment of FIG. 2

The operation of the embodiment of FIG. 2 will now be described. The digital signal source transmits to input I4 of current switch T15, T16 a digital signal which is either at an up level above ground potential or at a down level below ground potential. Assume first that the digital signal transmitted to input I4 is at an up level above ground potential. In this event, the current supplied by current source R8, V7 will flow entirely through current switch transistor T15 and the other current switch transistor T16 is cut off.

The potential of the collector of transistor T15 swings downwardly and is applied to the base of lower output transistor T18 to cut off the latter. The potential at the collector of current switch transistor T16 swings upwardly and current flows downwardly through load resistor R11 to drive the base of upper output transistor T17 to render the latter conductive. The emitter of upper output transistor T17 and hence also the output stage output O6 follows the base of upper output transistor T17 so that the potential of output O6 swings to an up level. Current flows from the $B^+$ terminal of the power supply through resistor R12 and upper output transistor T17 to output O6 and then to the load being driven.

Assume now that the digital signal transmitted to input I4 of current switch T15, T16 is at a lower level below ground potential. In this event, current switch transistor T15 is cut off and current switch transistor T16 is rendered conductive so that the current from source R8, V7 flows therethrough. The potential at the collector of transistor T16 swings downwardly and the potential at the collector of transistor T15 swings upwardly. The lower potential at the collector of transistor T16 is transmitted to the base of upper output transistor T17 to cut off the latter. The upper potential level at the collector of transistor T15 is transmitted to the base of lower output transistor T18 to render the latter conductive. That is, current flows from the $B^+$ terminal of the power supply downwardly through load resistor R10 to drive the base of lower output transistor T18. The potential at the collector of lower output transistor T18, and hence also the potential at output O6, swings downwardly to a down potential level to cause current from the load to flow into output O6 and then downwardly through output transistor T18 to the grounded $B^-$ terminal of the power supply.

Clamping transistor T19 clamps the collector of current switch transistor T15 when the latter is conductive so as to maintain transistor T15 out of saturation. As the potential of the collector of transistor T15 swings downwardly when a digital signal at the up level is transmitted to input I4, at a predetermined potential of the collector of transistor T15 the emitter of clamping transistor T18 is sufficiently below the potential at the base of transistor T19 to render the latter conductive. Current then flows through clamping transistor T19 to the collector of current switch transistor T15 to maintain the collector potential of transistor T15 at the predetermined level. This level is determined by the bias potential maintained at the base of clamping transistor T19 by the diode-connected transistor T20.

DELIMITATION OF THE INVENTION

It is to be understood that the preferred embodiments shown in the drawing and described above are merely illustrative of two of the many forms which the invention may take in practice and that numerous modifications thereof will readily occur to those skilled in the art without departing from the scope of the invention as delimited in the appended claims which are to be construed as broadly as permitted by the prior art.

We claim:

1. A line driver circuit comprising
a current switch including
an input adapted to receive an electrical digital signal at either one of two potential levels, and
a pair of outputs for transmitting respective electrical digital signals of mutually opposite phase so that the signal transmitted by one output is at one potential level and the signal transmitted by the other output is at another potential level,
a single-ended push-pull output stage including
a pair of inputs,
an output, and
means responsive to an electrical signal at an upper potential level at one of said output stage inputs and to an electrical signal at a lower potential level at the other of said output stage inputs for causing the potential of said output stage output to swing downwardly, and responsive to an electrical signal at a lower potential level at said one output stage input and to an electrical signal at an upper potential level at said other output stage input for causing the potential of said output stage output to swing upwardly,
first means direct-current coupling one of said current switch outputs to a first of said output stage inputs, and
second means direct-current coupling the other of said current switch outputs to a second of said output stage inputs,
means for limiting the amplitude of the downward swing of the output stage output potential,
an active feedback network having one end connected to said output stage output and another end connected to one of said current switch outputs.

2. A line driver circuit as set forth in claim 1 wherein said feedback network comprises
a feedback transistor having a collector and an emitter,
means connecting said feedback transistor emitter to said output stage output, and
means connecting said feedback transistor collector to said one output of said current switch.

3. A line driver circuit comprising
a current switch including
an input adapted to receive an electrical digital signal at either one of two potential levels, and
a pair of outputs for transmitting respective electrical digital signals of mutually opposite phase so that the signal transmitted by one output is at one potential level and the signal transmitted by the other output is at another potential level,
a single-ended push-pull output stage including
a pair of inputs,
an output, and
means responsive to an electrical signal at an upper potential level at one of said output stage inputs and to an electrical signal at a lower potential level at the other of said output stage inputs for causing the potential of said output stage output to swing downwardly, and responsive to an electrical signal at a lower potential level at said one output stage input and to an electrical signal at an upper potential level at said other output stage input for causing the potential of said output stage output to swing upwardly, first means direct-current coupling one of said current switch outputs to a first of said output stage inputs, and second means direct-current coupling the other of said current switch outputs to a second of said output stage inputs, a pair of transistors each having a collector, a base, and an emitter, a current source connected to said emitters, said current switch input being connected to one of said bases, and bias means connected to the other of said bases, one of said collectors being connected to one of said current switch outputs, the other of said collectors being connected to the other of said current switch outputs, a pair of load transistors of a conductivity type opposite to that of said current switch transistors, each of said load transistors having a collector connected to a collector of a respective one of said current switch transistors.

4. A line driver circuit comprising a current switch including an input adapted to receive an electrical digital signal at either one of two potential levels, and a pair of outputs for transmitting respective electrical digital signals of mutually opposite phase so that the signal transmitted by one output is at one potential level and the signal transmitted by the other output is at another potential level, a single-ended push-pull output stage including a pair of inputs, an output, and means responsive to an electrical signal at an upper potential level at one of said output stage inputs and to an electrical signal at a lower potential level at the other of said output stage inputs for causing the potential of said output stage output to swing downwardly, and responsive to an electrical signal at a lower potential level at said one output stage input and to an electrical signal at an upper potential level at said other output stage input for causing the potential of said output stage output to swing upwardly, first means direct-current coupling one of said current switch outputs to a first of said output stage inputs, and second means direct-current coupling the other of said current switch outputs to a second of said output stage inputs, a pair of transistors each having a collector, a base, and an emitter, a current source connected to said emitters, said current switch input being connected to one of said bases, and bias means connected to the other of said bases, one of said collectors being connected to one of said current switch outputs, the other of said collectors being connected to the other of said current switch outputs, means for limiting the amplitude of the downward swing of the output stage output potential, an active feedback network having one end connected to said output stage output and another end connected to one of said current switch outputs.

5. A line driver circuit as set forth in claim 4 wherein said feedback network comprises a feedback transistor having a collector and an emitter, means connecting said feedback transistor emitter to said output stage output, and means connecting said feedback transistor collector to said one output of said current switch.

6. A line driver circuit comprising a current switch including an input adapted to receive an electrical digital signal at either one of two potential levels, and a pair of outputs for transmitting respective electrical digital signals of mutually opposite phase so that the signal transmitted by one output is at one potential level and the signal transmitted by the other output is at another potential level, a single-ended push-pull output stage including a pair of inputs, an output, and means responsive to an electrical signal at an upper potential level at one of said output stage inputs and to an electrical signal at a lower potential level at the other of said output stage inputs for causing the potential of said output stage output to swing downwardly, and responsive to an electrical signal at a lower potential level at said one output stage input and to an electrical signal at an upper potential level at said other output stage input for causing the potential of said output stage output to swing upwardly, first means direct-current coupling one of said current switch outputs to a first of said output stage inputs, and second means direct-current coupling the other of said current switch outputs to a second of said output stage inputs, a pair of transistors each having a collector, a base, and an emitter, a current source connected to said emitters, said current switch input being connected to one of said bases, and bias means connected to the other of said bases, one of said collectors being connected to one of said current switch outputs, the other ofsaid collectors being connected to the other of said current switch outputs, a pair of load transistors of a conductivity type opposite to that of said current switch transistors, each of of said load transistors having a collector connected to a collector of a respective one of said current switch transistors.

7. A line driver circuit comprising a current switch including an input adapted to receive an electrical digital signal at either one of two potential levels, and a pair of outputs for transmitting respective electrical digital signals of mutually opposite phase so that the signal transmitted by one output is at one potential level and the signal transmitted by the other output is at another potential level, a single-ended push-pull output stage including a pair of inputs, an output, and means responsive to an electrical signal at an upper potential level at one of said output stage inputs and to an electrical signal at a lower potential level at the other of said output stage inputs for causing the potential of said output stage output to swing downwardly, and responsive to an electrical signal at a lower potential level at said one output stage input and to an electrical signal at an upper potential level at said other output stage input for causing the potential of said output stage output to swing upwardly, first means direct-current coupling one of said current switch outputs to a first of said output stage inputs, and second means direct-current coupling the other of said current switch outputs to a second of said output stage inputs, a pair of output transistors each having a collector, a base and an emitter, one of said output stage inputs being connected to one of said bases, the other of said output stage inputs being connected to the other of said bases, a power supply having two supply terminals, one of said output transistors having its collector connected to one of said supply terminals, the other of said output transistors having its emitter connected to the other supply terminals, and means connecting the emitter of said one output transistor and the collector of said other output transistor to said output stage output, means for limiting the amplitude of the downward swing of the output stage output potential, and an active feedback network having one end connected to said output stage output and another end connected to one of said current switch outputs.

8. A line driver circuit as set forth in claim 7 wherein said feedback network comprises a feedback transistor having a collector and an emitter, means connecting said feedback transistor emitter to said output stage output, and means connecting said feedback transistor collector to said one output of said current switch.

9. A line driver circuit comprising a current switch including an input adapted to receive an electrical digital signal at either one of two potential levels, and a pair of outputs for transmitting respective electrical digital signals of mutually opposite phase so that the signal transmitted by one output is at one potential level and the signal transmitted by the other output is at another potential level, a single-ended push-pull output stage including a pair of inputs, an output, first means direct-current coupling one of said current switch outputs to a first of said output stage inputs, and second means direct-current coupling the other of said current switch outputs to a second of said output stage inputs, said current switch comprising a pair of transistors each having a collector, a base, and an emitter, a current source connected to said emitters, said current switch input being connected to one of said bases, and bias means connected to the other of said bases, one of said collectors being connected to one of said current switch outputs, the other of said collectors being connected to the other of said current switch outputs, said output stage comprising a pair of output transistors each having a collector, a base and an emitter, one of said output stage inputs being connected to one of said bases, the other of said output stage inputs being connected to the other of said bases, a power supply having two supply terminals, one of said output transistors having its collector connected to one of said supply terminals, the other of said output transistors having its emitter connected to the other supply terminals, and means connecting the emitter of said one output transistor and the collector of said other output transistor to said output stage output, and a digital signal source having an output connected to said current switch input to transmit thereto said electrical digital signal at either one of two potential levels, a pair of load transistors of a conductivity type opposite to that of said current switch transistors, each of said load transistors hacing a collector connected to a collector of a respective one of said current switch transistors.

10. A line driver circuit as set forth in claim 9 and comprising means for limiting the amplitude of the downward swing of the output stage output potential.

11. A line driver circuit as set forth in claim 10 wherein said limiting means comprises an active feedback network having one end connected to said output stage output and another end connected to one of said current switch outputs.

12. A line driver circuit as set forth in claim 11 wherein said feedback network comprises a feedback transistor having a collector and an emitter, means connecting said feedback transistor emitter to said output stage output, and means connecting said feedback transistor collector to said one output of said current switch.

13. A line driver circuit as set forth in claim 12 and comprising means for limiting the upward swing of said output stage output potential.

14. A line driver circuit as set forth in claim 13 wherein said last-recited limiting means comprises a clamping diode, a voltage source, means connecting one end of said diode to said voltage source, and means connecting the other end of said diode to one of said current switch outputs.

* * * * *